(12) United States Patent
Chen

(10) Patent No.: US 7,543,196 B2
(45) Date of Patent: Jun. 2, 2009

(54) APPARATUS FOR TESTING INTEGRATED CIRCUIT

(75) Inventor: Po Chang Chen, Taipei County (TW)

(73) Assignee: Princeton Technology Corporation, Taipei County (TW)

( * ) Notice: Subject to any disclaimer, the term of this patent is extended or adjusted under 35 U.S.C. 154(b) by 335 days.

(21) Appl. No.: 11/698,122

(22) Filed: Jan. 26, 2007

(65) Prior Publication Data
US 2008/0079454 A1 Apr. 3, 2008

(30) Foreign Application Priority Data
Sep. 29, 2006 (TW) .............................. 95217452 U

(51) Int. Cl.
G01R 31/28 (2006.01)

(52) U.S. Cl. .................. 714/700; 324/763; 360/69; 360/55; 369/30.27; 369/44.11

(58) Field of Classification Search ........................ None
See application file for complete search history.

(56) References Cited

U.S. PATENT DOCUMENTS

| 4,268,905 A | * | 5/1981 | Johann et al. ................. 703/13 |
| 5,200,678 A | * | 4/1993 | Tokashiki et al. ...... 318/568.13 |
| 5,740,137 A | * | 4/1998 | Kim ........................ 369/44.28 |
| 6,462,686 B2 | * | 10/2002 | Asano et al. ................. 341/143 |

* cited by examiner

*Primary Examiner*—John P Trimmings
*Assistant Examiner*—Steven D Radosevich
(74) *Attorney, Agent, or Firm*—Muncy, Geissler, Olds & Lowe, PLLC

(57) ABSTRACT

An apparatus for testing integrated circuits is disclosed. The apparatus for testing integrated circuits comprises an integrated circuit and a tester. The integrated circuit undergoing testing receives an input signal, and outputs an output signal from a first output terminal or a second output terminal according to a first pulse width of the input signal, and outputs an error signal according to a difference between the first pulse width and a second pulse width. The tester outputs the input signal according to the output signal and the error signal.

17 Claims, 7 Drawing Sheets

APPARATUS FOR TESTING INTEGRATED CIRCUIT

BACKGROUND OF THE INVENTION

1. Field of the Invention

The invention relates to an apparatus for testing integrated circuits (IC), and more particularly to an apparatus for testing servo motor control integrated circuits (IC).

2. Description of the Related Art

A servo motor control integrated circuit (IC) determines output signals and a pulse width of each output signal according to an input signal with fixed period and pulse width modulation (PWM). A dead band (DB) region occurs when all output signals are deasserted in the servo motor control integrated circuit.

FIG. 1 is an exemplary pin diagram of a conventional servo motor control IC 100. A first pin is an input terminal for receiving an input PWM signal $IN_{PWM}$ with fixed period. Second and third pins are output terminals for respectively generating a first output signal $OUT_1$ and a second output signal $OUT_2$ according to the input signal $IN_{PWM}$. The first output signal $OUT_1$ and second output signal $OUT_2$ are not asserted at the same time. A fourth pin is the output terminal for outputting an analog error signal $E_A$.

FIG. 2 is a waveform diagram of each signal of the conventional servo motor control IC. In FIG. 2, label II represents a dead band state in which the IC operates in the dead band region and the first output signal $OUT_1$ and second output signal $OUT_2$ are deasserted. Label III represents a second state in which only the second output signal $OUT_2$ is asserted, and label I represents a first state in which only the first output signal $OUT_1$ is asserted. For example, the IC is operated in the dead band region if the period of input signal $IN_{PWM}$ is 20 ms and the pulse width of input signal $IN_{PWM}$ is 1.5 ms.

As shown in FIG. 2, in the dead band state the IC operates in the dead band region when the pulse width of input signal $IN_{PWM}$ is 1.5 ms, and the first output signal $OUT_1$ and second output signal $OUT_2$ are deasserted. In the first state the first output signal $OUT_1$ is only asserted if the pulse width of input signal $IN_{PWM}$ is less than 1.5 ms. In the second state the second output signal $OUT_2$ is only asserted if the pulse width of input signal $IN_{PWM}$ is more than 1.5 ms.

The ability to detect the window of a dead band region is critical for servo motor control ICs. Each servo motor control IC, for example, must have three states as described in FIG. 2. FIG. 3 is a conventional apparatus for testing servo motor control IC 310. In FIG. 3, an output terminal of tester 320 is coupled to a first pin of IC 310, and second and third pins of IC 310 are coupled to the input terminals of tester 320 respectively. Tester 320 transmits the input signal $IN_{PWM}$ to IC 310, and receives the first output signal $OUT_1$ and the second output signal $OUT_2$ from 310. Tester 320 can then gradually modulate the pulse width of input signal $IN_{PWM}$; thus, IC 310 can operate separately in the first, second, and dead band states. The dead band state contains the entire dead band region.

FIG. 4 is an exemplary waveform diagram of testing signals of conventional servo motor control IC 310. First, the pulse width of input signal $IN_{PWM}$ output from tester 320 is 1401 µs, as shown in FIG. 4. Tester 320 subsequently receives the first output signal $OUT_1$ from IC 310. Referring back to FIG. 2, only the first output signal $OUT_1$ is asserted within the first state, i.e. the pulse width of input signal $IN_{PWM}$ is shorter than the pulse width of dead band region. Thus, tester 320 gradually increases the pulse width of input signal $IN_{PWM}$ by one micro-second at a time. IC 310 can operate in the dead band state until the pulse width of input signal $IN_{PWM}$ is increased to 1501 µs, and the first output signal $OUT_1$ and second output signal $OUT_2$ are deasserted. After that, tester 320 continuously increases the pulse width of input signal $IN_{PWM}$ gradually until the second output signal $OUT_2$ is asserted. In FIG. 4, the dead band region is from 1501 to 1508 µs, and the dead band region interval is 8 µs.

The region and interval of dead band of each servo motor control IC, due to process variability, are not the same. For example, the dead band region of servo motor control IC ranges between 1530 µs and 1534 µs or between 1487 µs and 1495 µs. For this reason, the pulse width of input signal $IN_{PWM}$ must contain the total dead band region of the IC. For example, the pulse width of input signal $IN_{PWM}$ from tester 320 ranges between 1401 µs and 1600 µs, and is adequate to contain the total dead band region of the IC, i.e. 200 fixed cycles are required to test one IC. Testing time, however, increases with an increased pulse width modulation region. Conversely, decreasing the pulse width modulation range may not detect dead band regions and thus reduce yield.

BRIEF SUMMARY OF THE INVENTION

Apparatuses for testing integrated circuits are provided. An exemplary embodiment of an apparatus for testing integrated circuits comprises an integrated circuit and a tester. The integrated circuit undergoing testing is used for receiving an input signal, and outputting an output signal from a first output terminal or a second output terminal according to a first pulse width of the input signal, and generating an error signal according to a difference between the first pulse width and a second pulse width. The tester for outputting the input signal according to the output signal and the error signal.

Another exemplary embodiment of an apparatus for testing integrated circuits comprises an integrated circuit an adjustment circuit and a tester. The integrated circuit undergoing testing is used for receiving an input signal, and outputting an output signal from a first output terminal or a second output terminal according to a first pulse width of the input signal, and generating an error signal according to a difference between the first pulse width and a second pulse width. The adjustment circuit receives the error signal and outputs an adjustment signal according to the error signal. And the tester outputs the input signal according to the output signal and the adjustment signal.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
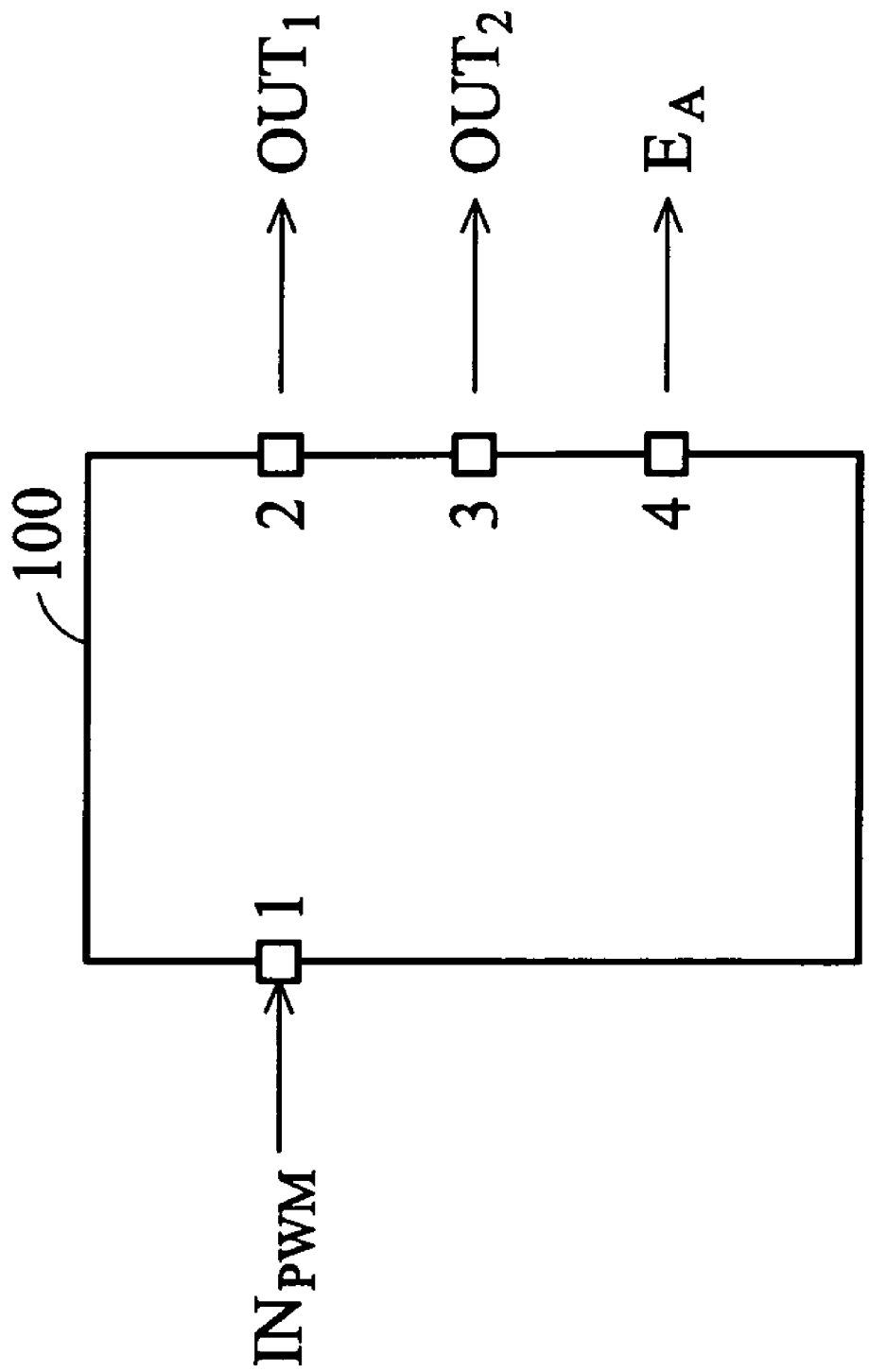
FIG. 1 is an exemplary pin diagram of a conventional servo motor control IC.
Figure 2:
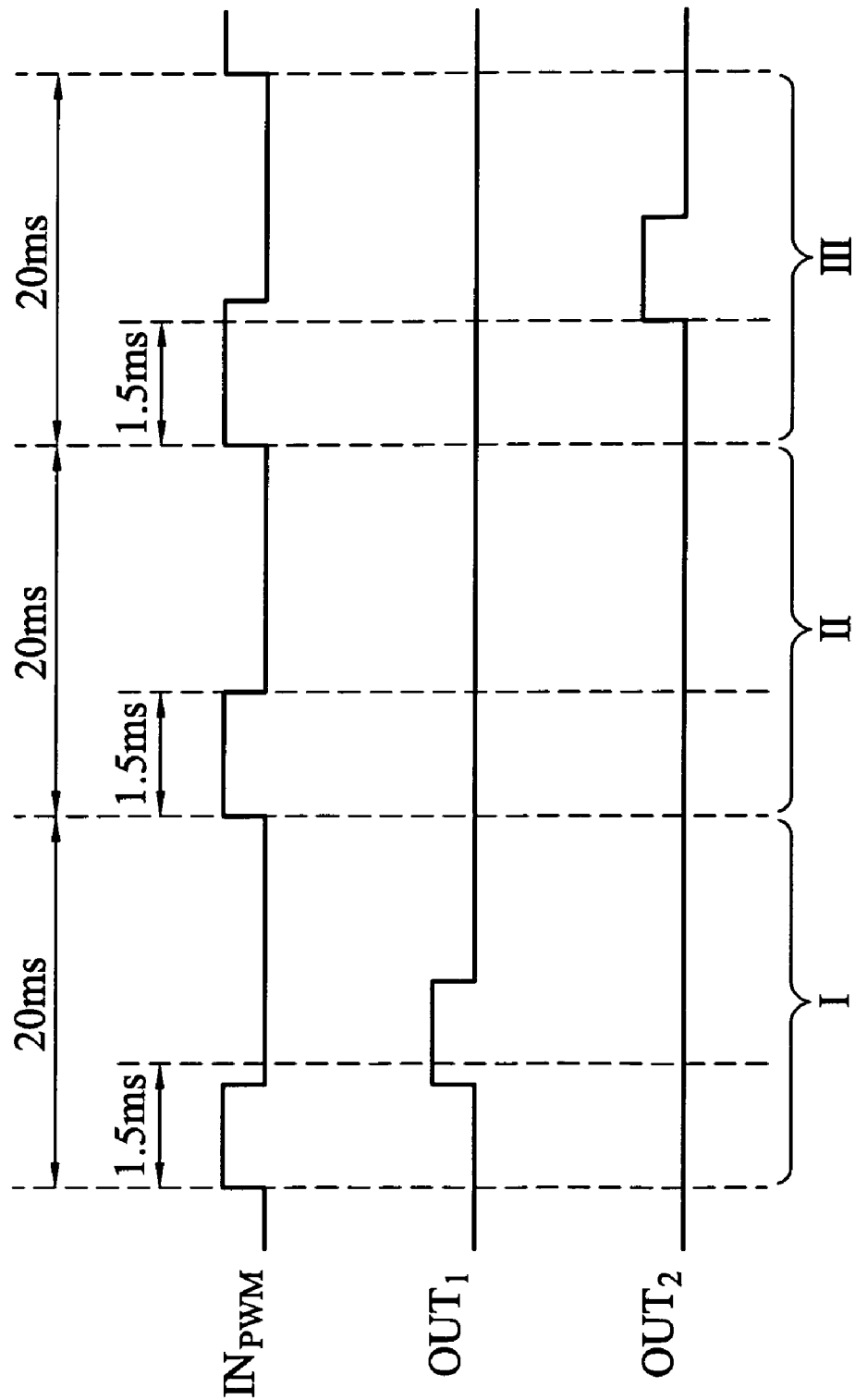
FIG. 2 is a waveform diagram of each signal of a conventional servo motor control IC.
Figure 3:
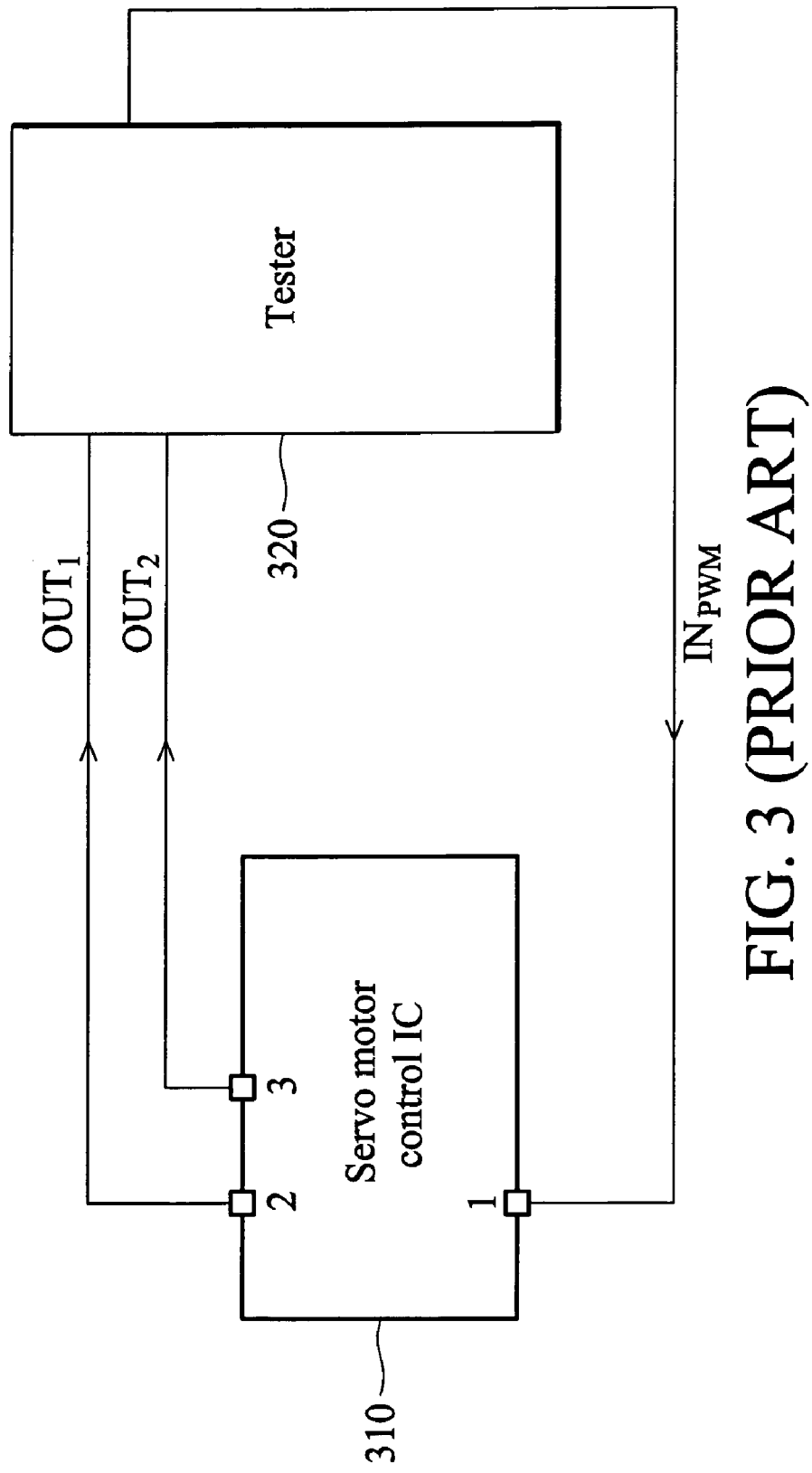
FIG. 3 is a conventional apparatus for testing servo motor control ICs.
Figure 4:
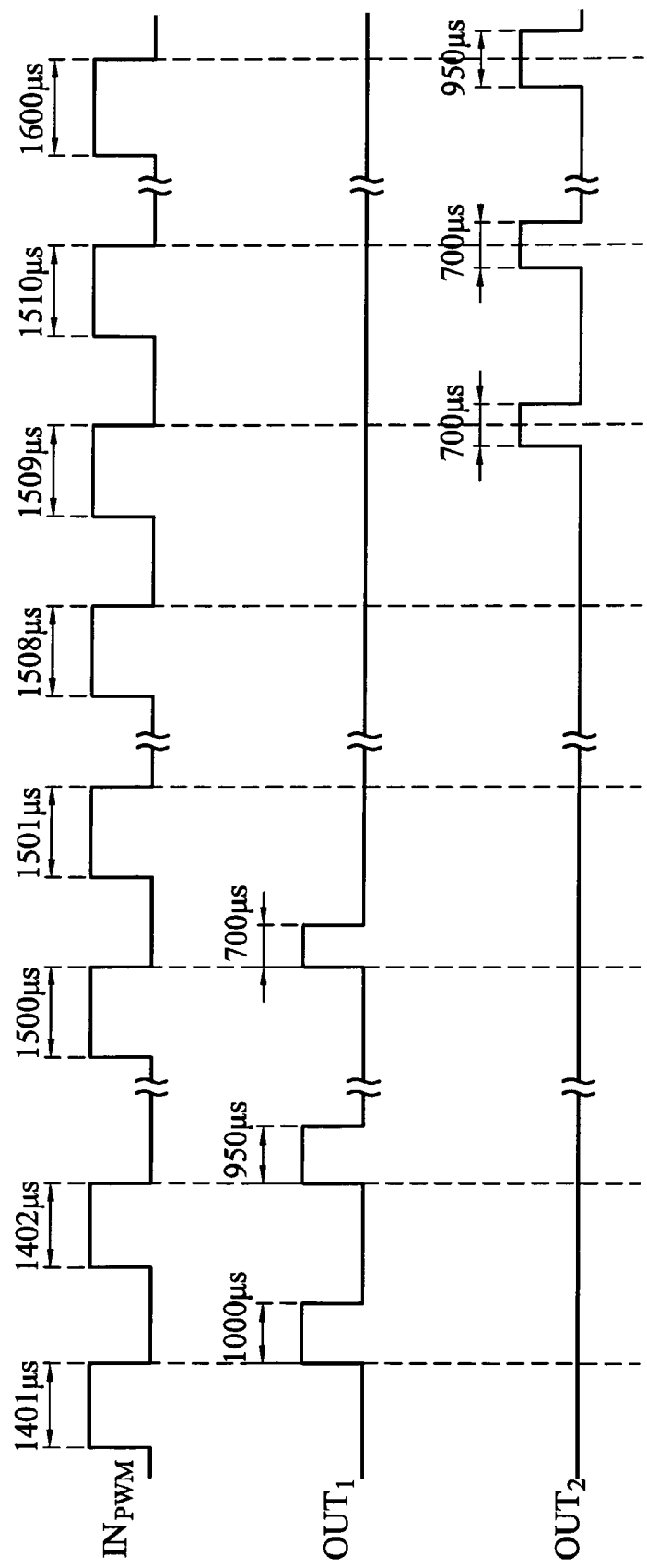
FIG. 4 is an exemplary waveform diagram of testing signals of a conventional servo motor control IC.
Figure 5:
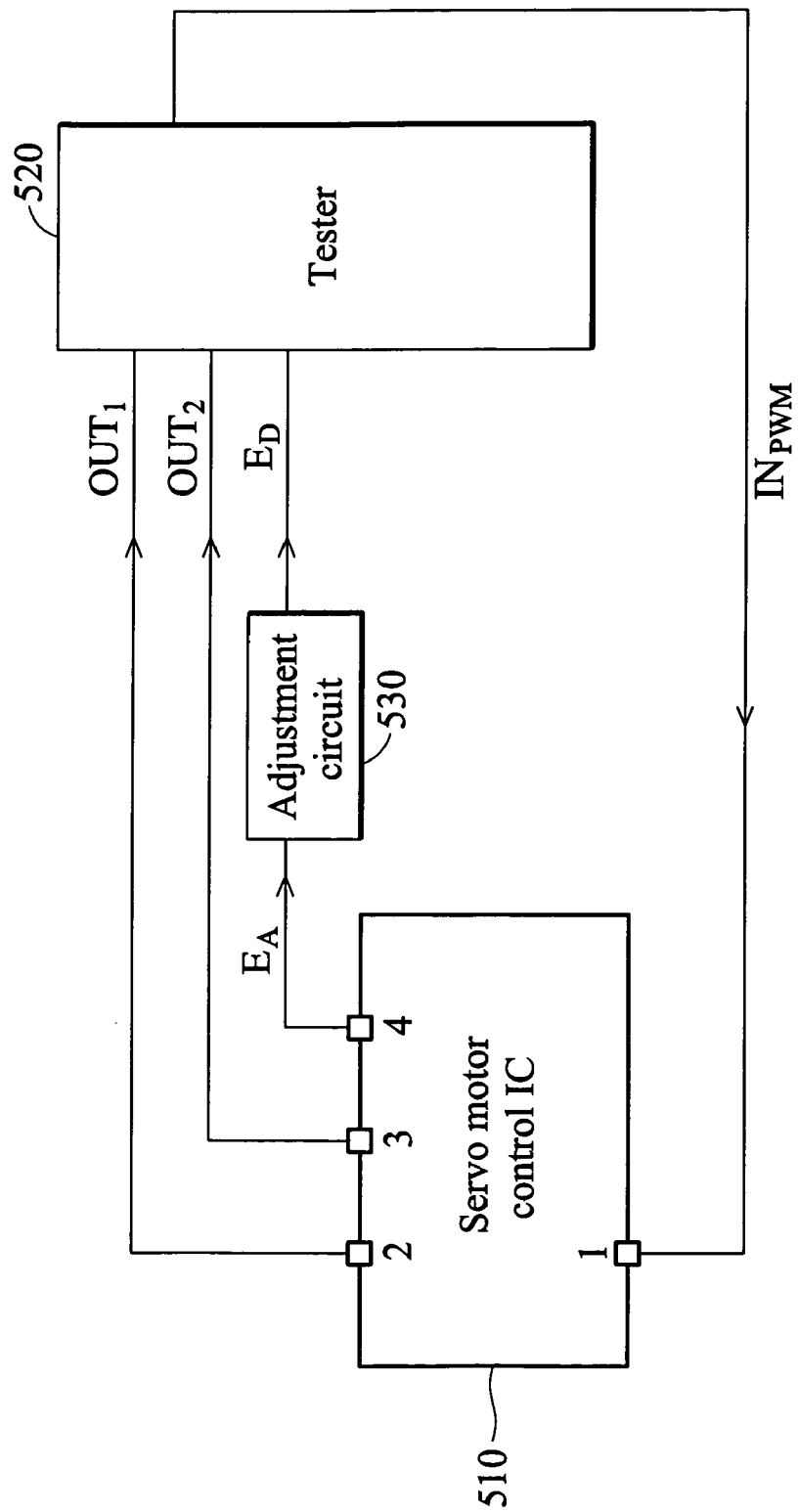
FIG. 5 is an apparatus for testing servo motor control IC according to an embodiment of the invention.

FIG. 5 is an apparatus for testing a servo motor control IC 510 according to an embodiment of the invention. First, an input signal $IN_{PWM}$ with a fixed pulse width is output by tester 520. IC 510 will then output a first output signal $OUT_1$ or a second output signal $OUT_2$ selectively according to the fixed pulse width of input signal $IN_{PWM}$. An analog error signal $E_A$ is also output by IC 510. As shown in FIG. 5, an adjustment circuit 530, such as an analog to digital converter, converts the analog error signal $E_A$ to a digital error signal $E_D$. The analog error signal $E_A$ is the difference between the pulse width of input signal $IN_{PWM}$ and the pulse width of the dead band region. Tester 520 subsequently receives the first output signal $OUT_1$, second output signal $OUT_2$ and digital error signal $E_D$, and determines the pulse width of the following input signal $IN_{PWM}$ according to the received signals. The testing time for IC 510 entering the dead band region is reduced by modulating the pulse width of input signal $IN_{PWM}$ with the pulse width of digital error signal $E_D$.

Figure 6:
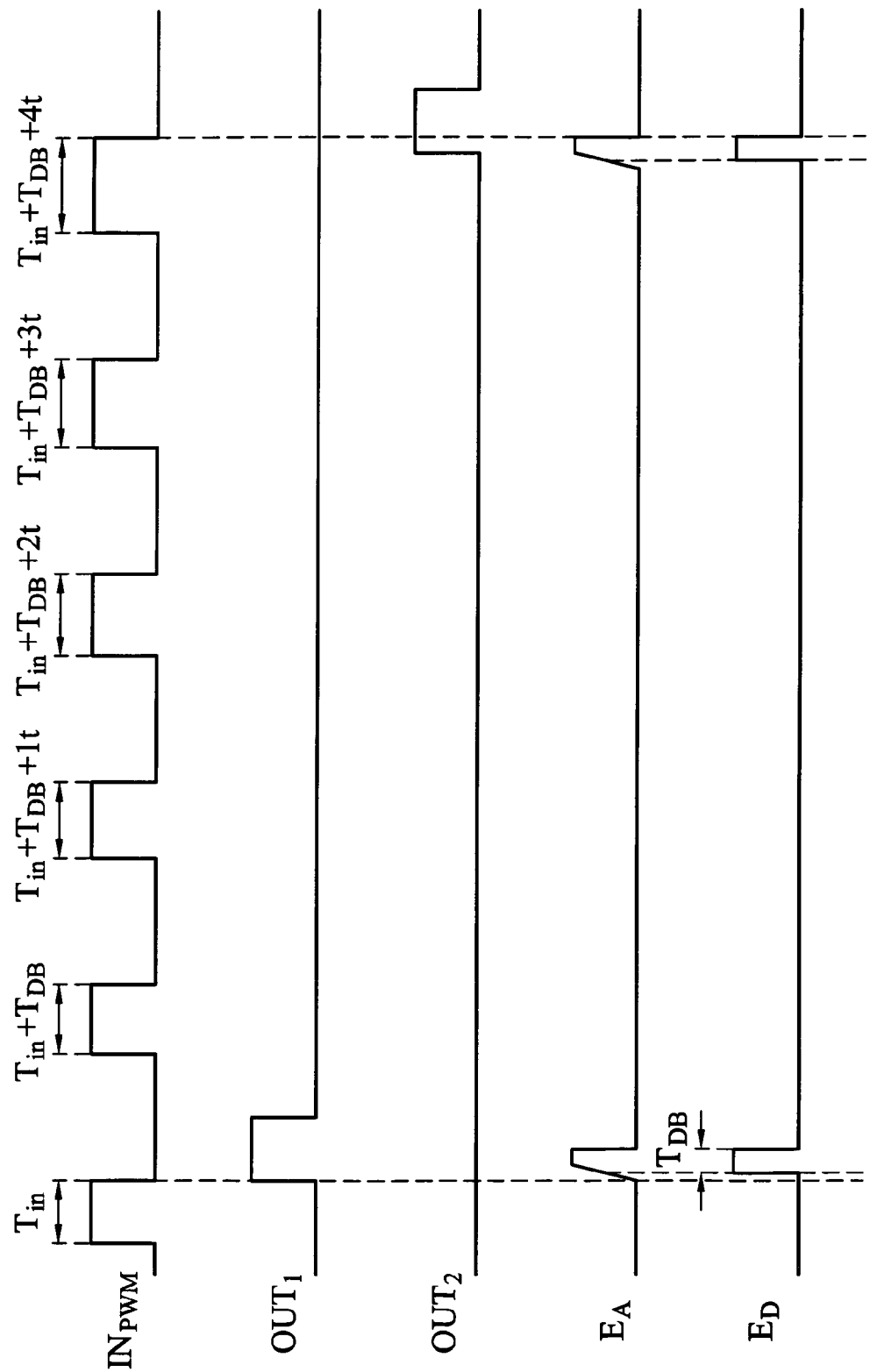
FIG. 6 is a waveform diagram of the apparatus according to an embodiment of the invention.

FIG. 6 is a waveform diagram of the apparatus according to an embodiment of the invention. First, tester 520 outputs a first pulse of input signal $IN_{PWM}$ the pulse width of which is $T_{in}$. IC 510 then outputs the first output signal $OUT_1$ and analog error signal $E_A$ according to the first pulse of input signal $IN_{PWM}$. At the same time, the analog error signal $E_A$ is received and converted to the digital error signal $E_D$ by adjustment circuit 530. Tester 520 determines that IC 510 is operating in the first state, because only the first output signal $OUT_1$ is asserted and the second signal is deasserted. Tester 520 can also determine the pulse width of input signal $IN_{PWM}$ for IC 510 entering the dead band region according to a pulse width of digital error signal $E_D$ and the operating state of IC 510. For example, tester 520 may determine that the pulse width for IC 510 entering the dead band region is $T_{in}+T_{DB}$. Tester 520 then outputs a second pulse of input signal $IN_{PWM}$ the pulse width of which is $T_{in}+T_{DB}$, and IC 510 enters the dead band region after receiving the second pulse of input signal $IN_{PWM}$. IC 510 does not output the first output signal $OUT_1$, second output signal $OUT_2$ or analog error signal $E_A$ and digital error signal $E_D$ is also deasserted. Tester 520 can then determine that IC 510 is operating in the dead band region because no signal is received from IC 510.

Tester 520 then gradually increases the pulse width of input signal $IN_{PWM}$ until IC 510 operates from dead band state to the second state, and finishes the test for IC 510. For example, pulse widths of third, fourth and fifth pulses of input signal $IN_{PWM}$ are $T_{in}+T_{DB}+1t$, $T_{in}+T_{DB}+2t$ and $T_{in}+T_{DB}+3t$ respectively, wherein t is 1 μs. IC 510 operates from dead band state to the second state and generates the second output signal $OUT_2$ and analog error signal $E_A$ until tester 520 generates a sixth pulse of input signal $IN_{PWM}$ the pulse width of which is $T_{in}+T_{DB}+4t$. Therefore, tester 520 can detect that IC 510 operates in the first, dead band and second states sequentially, wherein the dead band region is from $T_{in}+T_{DB}$ to $T_{in}+T_{DB}+3t$ and the dead band region interval is 4 μs. As shown in FIG. 6, the dead band region in IC 510 is completely measured by six pulses of input signal $IN_{PWM}$ with fixed period, and the time required for testing the IC of the invention is less than that required by the conventional method.

Figure 7:
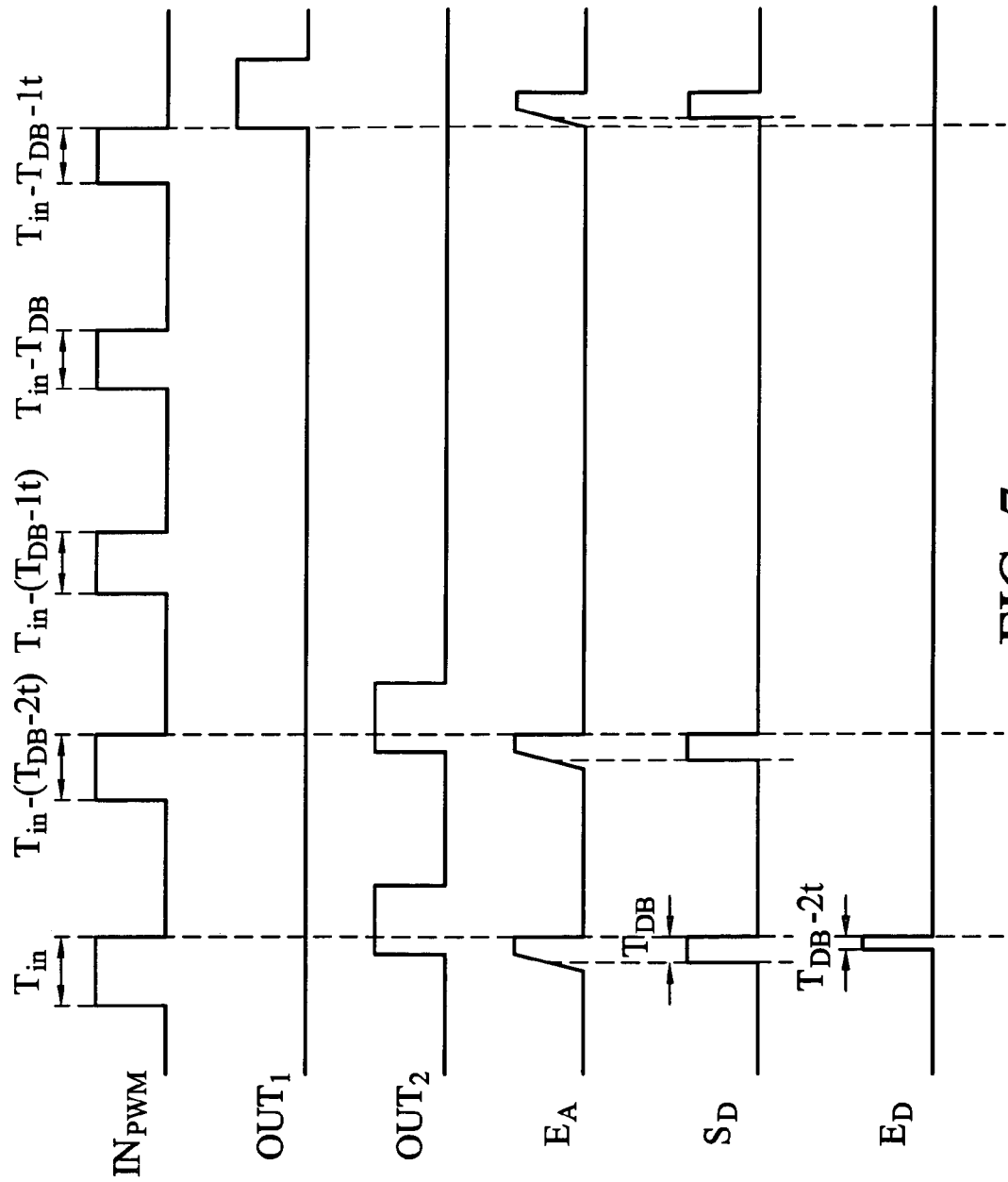
FIG. 7 is a waveform diagram of the apparatus according to another embodiment of the invention.

FIG. 7 is a waveform diagram of the apparatus according to another embodiment of the invention. First, tester 520 outputs a first pulse of input signal $IN_{PWM}$ the pulse width of which is $T_{in}$. IC 510 then outputs the second output signal $OUT_2$ and analog error signal $E_A$ according to the first pulse of input signal $IN_{PWM}$. At the same time, adjustment circuit 530 receives the analog error signal $E_A$ and converts to a digital signal $S_D$ the pulse width of which is $T_{DB}$, and then decreases the pulse width of digital signal $S_D$ by a predetermined value (ex. 2t and t is 1 μs) to generate the digital error signal $E_D$, wherein the pulse width of the digital error signal $E_D$ is $T_{DB}-2t$. Tester 520 can determine that IC 510 is operating in the second state, because only the second output signal $OUT_2$ and the digital error signal $E_D$ are asserted. Tester 520 can also determine the pulse width of input signal $IN_{PWM}$ for IC 510 entering the dead band region according to the pulse width of digital error signal $E_D$ and the operating state of IC 510. For example, tester 520 may determine that the pulse width of input signal $IN_{PWM}$ for IC 510 entering the dead band region is $T_{in}-(T_{DB}-2t)$. Then, tester 520 generates a second pulse of input signal $IN_{PWM}$ the pulse width of which is $T_{in}-(T_{DB}-2t)$, and IC 510 generates the second output signal $OUT_2$ and analog error signal $E_A$ after the second pulse of input signal $IN_{PWM}$ is received by IC 510. Adjustment circuit 530 receives the analog error signal $E_A$ and converts to the digital signal $S_D$. The digital error signal $E_D$ is then deasserted because the pulse width of digital signal $S_D$ is less than 2t. Thus, tester 520 can determine that IC 510 will operate in the dead band region, because the second output signal $OUT_2$ is asserted and the digital error signal $E_D$ is deasserted.

Tester 520 can then gradually decrease the pulse width of input signal $IN_{PWM}$ until IC 510 operates in the second, dead band and first states sequentially, finally, testing of IC 510 is complete. As shown in FIG. 7, pulse widths of third, fourth and fifth pulses of input signal $IN_{PWM}$ are $T_{in}-(T_{DB}-1t)$, $T_{in}-T_{DB}$ and $T_{in}-T_{DB}-1t$ respectively, wherein t is 1 μs. IC 510 operates in the dead band region while the third pulse of input signal $IN_{PWM}$ is received, and operates in the first state while the fifth pulse of input signal $IN_{PWM}$ is received, wherein the first output signal $OUT_1$ and analog error signal $E_A$ are asserted. Thus, tester 520 can detect that IC 510 operates in the second, dead band and first states sequentially, wherein the dead band region is from $T_{in}-(T_{DB}-1t)$ to $T_{in}-T_{DB}$ and the interval of dead band region is 2 μs. If the dead band region is too narrow, the pulse width of the digital error signal $E_D$ can be fine tuned to prevent the IC 510 from operating in the first state directly to the second state and skipping the dead band state. The dead band region and the dead band region interval can also be observed accurately by fine tuning the pulse width of the digital error signal $E_D$ with adjustment circuit 530, i.e. the boundary of the first and dead band states and the boundary of the second and dead band states can be completely detected.

If IC 510 operation in the dead band state is initially detected by tester 520, i.e. no outputs are asserted, tester 520 can gradually increase or decrease the pulse width of input signal $IN_{PWM}$ to verify that IC 510 is capable of entering the second or first states, and then respectively operates from the second or first states to the first or second states and through the dead band state.

In another embodiment of the invention, the IC 510 can comprise the function of adjustment circuit 530. For example, analog signals can be converted to digital signals or the pulse width error signal can be fine tuned, thus, IC 510 can directly output the digital error signal $E_D$. Similarly, tester 520 can determine the pulse width of the following input signal $IN_{PWM}$ according to the first output signal $OUT_1$, second output signal $OUT_2$ and digital error signal $E_D$.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. An apparatus for testing integrated circuits, comprising:
   an integrated circuit undergoing testing for receiving an input signal, and outputting an output signal from a first output terminal or a second output terminal according to a first pulse width of the input signal, and generating an error signal according to a difference between the first pulse width and a second pulse width; and
   a tester for outputting the input signal according to the output signal and the error signal.

2. The apparatus as claimed in claim 1, wherein the tester modulates the first pulse width according to the output signal and the error signal.

3. The apparatus as claimed in claim 1, wherein the second pulse width is determined by the process variation of the integrated circuit undergoing testing.

4. The apparatus as claimed in claim 1, wherein the error signal is deasserted when the first pulse width is equal to the second pulse width.

5. The apparatus as claimed in claim 1, wherein the output signal is deasserted when the first pulse width is equal to the second pulse width.

6. The apparatus as claimed in claim 1, wherein the integrated circuit undergoing testing is a servo motor control integrated circuit.

7. The apparatus as claimed in claim 1, wherein the error signal is a digital signal.

8. An apparatus for testing integrated circuits, comprising:
   an integrated circuit undergoing testing for receiving an input signal, and outputting an output signal from a first output terminal or a second output terminal according to a first pulse width of the input signal, and generating an error signal according to a difference between the first pulse width and a second pulse width;
   an adjustment circuit for receiving the error signal, and outputting an adjustment signal according to the error signal; and
   a tester for outputting the input signal according to the output signal and the adjustment signal.

9. The apparatus as claimed in claim 8, wherein the tester modulates the first pulse width according to the output signal and the adjustment signal.

10. The apparatus as claimed in claim 8, wherein the second pulse width is determined by process variation of the integrated circuit undergoing testing.

11. The apparatus as claimed in claim 8, wherein the error signal is deasserted when the first pulse width is equal to the second pulse width.

12. The apparatus as claimed in claim 8, wherein the output signal is deasserted when the first pulse width is equal to the second pulse width.

13. The apparatus as claimed in claim 8, wherein the integrated circuit undergoing testing is a servo motor control integrated circuit.

14. The apparatus as claimed in claim 8, wherein the adjustment circuit receives the error signal and modulates a pulse width of the error signal to generate the adjustment signal.

15. The apparatus as claimed in claim 8, wherein the error signal is an analog signal.

16. The apparatus as claimed in claim 15, wherein the adjustment circuit receives the error signal and converts the error signal to a digital format to generate the adjustment signal.

17. The apparatus as claimed in claim 15, wherein the adjustment circuit receives the error signal and converts the error signal to a digital signal, and modulates a pulse width of the digital signal to generate the adjustment signal.

* * * * *